United States Patent
Moon et al.

(10) Patent No.: US 9,419,028 B1
(45) Date of Patent: Aug. 16, 2016

(54) METHOD OF MANUFACTURING DISPLAY DEVICE AND FORMING AN ALIGNMENT MARK HAVING CONCAVE AND CONVEX PORTIONS FORMED ALONG A FIRST PATTERN

(71) Applicant: Samsung Display Co., Ltd., Yongin-si, Gyeonggi-do (KR)

(72) Inventors: Sangho Moon, Yongin-si (KR); Sangkyung Lee, Yongin-si (KR); Jongmoo Huh, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/827,055

(22) Filed: Aug. 14, 2015

(30) Foreign Application Priority Data

Jan. 26, 2015 (KR) .......................... 10-2015-0012312

(51) Int. Cl.
| | | |
|---|---|---|
| *H01L 21/76* | (2006.01) | |
| *H01L 27/12* | (2006.01) | |
| *H01L 29/66* | (2006.01) | |
| *H01L 29/786* | (2006.01) | |
| *H01L 23/544* | (2006.01) | |
| *H01L 21/441* | (2006.01) | |

(52) U.S. Cl.
CPC .......... *H01L 27/1262* (2013.01); *H01L 21/441* (2013.01); *H01L 23/544* (2013.01); *H01L 29/66969* (2013.01); *H01L 29/7869* (2013.01); *H01L 2223/54426* (2013.01)

(58) Field of Classification Search
CPC ................... H01L 21/68; H01L 2021/60075; H01L 51/0012
USPC .................................................. 438/401, 462
See application file for complete search history.

(56) References Cited

U.S. PATENT DOCUMENTS

| | | |
|---|---|---|
| 2013/0270527 A1 | 10/2013 | Kwon et al. |
| 2014/0138646 A1 | 5/2014 | Lee et al. |
| 2015/0200304 A1* | 7/2015 | Kim ..................... H01L 29/7869 257/43 |

FOREIGN PATENT DOCUMENTS

| | | |
|---|---|---|
| KR | 10-2004-0010877 A | 2/2004 |
| KR | 10-2013-0115657 A | 10/2013 |
| KR | 10-2014-0065284 A | 5/2014 |
| KR | 10-2014-0083447 A | 7/2014 |

* cited by examiner

*Primary Examiner* — Hoai V Pham

(74) *Attorney, Agent, or Firm* — Knobbe Martens Olson & Bear LLP

(57) ABSTRACT

A method of manufacturing a display device is disclosed. In one aspect, the method includes forming an active layer over a substrate, forming a first insulating layer over the active layer, forming a gate electrode over the active layer, and forming an alignment mark over the substrate. The forming of the alignment mark includes forming a first layer including a first pattern and forming a second layer over the first layer and including concave and convex portions formed along the first pattern. The first insulating layer is interposed between the first and second layers.

18 Claims, 18 Drawing Sheets

METHOD OF MANUFACTURING DISPLAY DEVICE AND FORMING AN ALIGNMENT MARK HAVING CONCAVE AND CONVEX PORTIONS FORMED ALONG A FIRST PATTERN

INCORPORATION BY REFERENCE TO ANY PRIORITY APPLICATIONS

This application claims the benefit of Korean Patent Application No. 10-2015-0012312, filed on Jan. 26, 2015, in the Korean Intellectual Property Office, the disclosure of which is incorporated herein in its entirety by reference.

BACKGROUND

1. Field

The described technology generally relates to a method of manufacturing a display device.

2. Description of the Related Technology

A liquid crystal display (LCD) operates based on an electrical interaction with a liquid crystal that has properties between those of liquid and those of solid crystal. The liquid crystal includes an array of liquid crystal particles whose orientation and optical characteristics such as birefringence, optical activity, and light scattering change in response to an external electric field applied thereto.

An organic light-emitting diode (OLED) display is a self-emissive display that does not require a separate light source (e.g., backlight), can operate using low voltage and has reduced weight and thickness. OLED technology has favorable characteristics such as wide viewing angle, high contrast, and fast response time. Accordingly, OLED displays are considered the next generation display device.

Electrodes and lines of a display device can be formed via a patterning process. In particular, as the demand for high-definition display devices has increased, more electrical lines and components are used to achieve this purpose, which have a complicated structure, and thus, it is important to form the lines and the components at exact positions.

SUMMARY OF CERTAIN INVENTIVE ASPECTS

One inventive aspect relates to a method of manufacturing a display device.

Another aspect is a method of manufacturing a display device that includes operations of forming an active layer on a substrate; forming a first insulating layer on the active layer; forming a gate electrode over the active layer; and forming an alignment mark on the substrate, wherein the forming of the alignment mark includes operations of forming a first layer having a first pattern; and forming a second layer that is formed over the first layer and has concave and convex portions formed along the first pattern.

The first layer can have light-transmittance.

The active layer can include an oxide semiconductor.

The first layer can be formed from a same layer as the active layer.

The second layer can be formed from a same material layer as the gate electrode.

The second layer can completely cover the first layer.

The concave and convex portions of the second layer can include the convex portions that are formed along the first pattern of the first layer and the concave portions that are relatively recessed with respect to the convex portions.

The method can further include an operation of forming a source electrode and a drain electrode at two sides of a first portion of the active layer, wherein the first portion overlaps the gate electrode.

The first layer can include a same material as the first portion.

The method can further include an operation of forming, by using the alignment mark, a data input electrode that is connected to one of the source and drain electrodes and a data output electrode that is connected to the other one of the source and drain electrodes.

The data output electrode can be electrically connected to a pixel electrode.

The method can further include operations of forming a second insulating layer between the data input and output electrodes and the gate electrode; and forming, by using the alignment mark, contact holes that penetrate the second insulating layer.

The substrate can include a pixel region and an outer region that surrounds the pixel region, wherein the active layer and the gate electrode are formed in the pixel region, and the alignment mark is formed in the outer region.

Another aspect is a method of manufacturing a display device, the method comprising: forming an active layer over a substrate; forming a first insulating layer over the active layer; forming a gate electrode over the active layer; and forming an alignment mark over the substrate. The forming of the alignment mark comprises: forming a first layer including a first pattern; and forming a second layer over the first layer and including concave and convex portions formed along the first pattern.

In the above method, the first layer is light transmissive.

In the above method, the active layer is formed of an oxide semiconductor.

In the above method, the first layer is formed on the same layer as the active layer.

In the above method, the second layer is formed of the same material as the gate electrode.

In the above method, the second layer completely covers the first layer.

In the above method, the convex portions of the second layer are formed along the first pattern of the first layer, wherein the concave portions of the second layer are recessed with respect to the convex portions.

The above method further comprises forming source and drain electrodes at two sides of a first portion of the active layer, wherein the first portion overlaps the gate electrode.

In the above method, the first layer is formed of the same material as the first portion.

The above method further comprises forming, via the alignment mark, a data input electrode, connected to one of the source and drain electrodes, and a data output electrode, connected to the other one of the source and drain electrodes.

In the above method, the data output electrode is electrically connected to a pixel electrode.

The above method further comprises: forming a second insulating layer between the data input and output electrodes and the gate electrode; and forming, via the alignment mark, a plurality of contact holes penetrating the second insulating layer.

In the above method, the substrate comprises a pixel region and a peripheral region surrounding the pixel region, wherein the active layer and the gate electrode are formed in the pixel region, and wherein the alignment mark is formed in the peripheral region.

Another aspect is a method of manufacturing a display device, the method comprising: concurrently forming an active pattern and a first layer of an alignment mark over a substrate; and concurrently forming a gate electrode and a second layer of the alignment mark over the substrate, wherein the first layer includes a first pattern, and wherein the second layer is formed over the first layer and includes concave and convex portions formed along the first pattern.

In the above method, the second layer completely covers the first layer.

In the above method, the convex portions of the second layer are formed along the first pattern of the first layer, wherein the concave portions of the second layer are recessed with respect to the convex portions.

The above method further comprises forming a first insulating layer between forming the first and second layers.

In the above method, at least one groove is formed in a top portion of the second layer.

DETAILED DESCRIPTION OF CERTAIN INVENTIVE EMBODIMENTS

Figure 1:
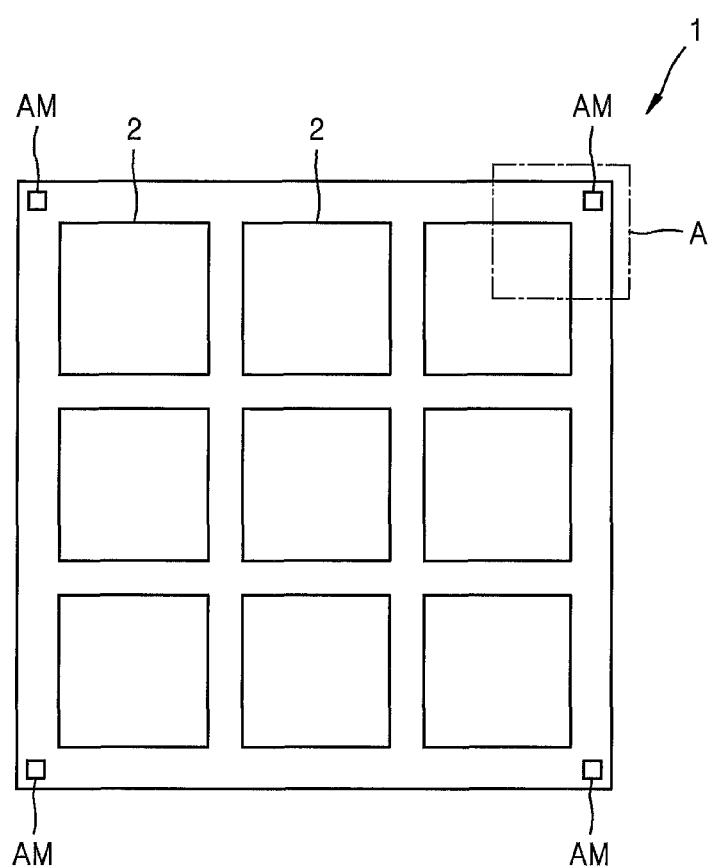
FIG. 1 is a plan view illustrating a mother substrate for manufacture of a display device, according to an exemplary embodiment.

As the described technology allows for various changes and numerous embodiments, particular embodiments will be illustrated in the drawings and described in detail in the written description. The effects and features of the described technology will now be described more fully with reference to the accompanying drawings, in which exemplary embodiments are shown. The described technology can, however, be embodied in many different forms and should not be construed as being limited to the embodiments set forth herein.

Those components that are the same or are in correspondence are rendered the same reference numeral regardless of the figure number, and redundant explanations are omitted.

Throughout the specification, while such terms as "first," "second," etc., can be used to describe various components, such components must not be limited to the above terms. The above terms are used only to distinguish one component from another.

Throughout the specification, a singular form can include plural forms, unless there is a particular description contrary thereto.

Throughout the specification, terms such as "comprise" or "comprising" are used to specify existence of features and/or components described in the specification, not excluding the existence of one or more other features and/or one or more other components.

It will be understood that when a layer, an area, a component, or the like is referred to as being "on" another layer, area, or component can be directly on another layer, area, or component or intervening layer, area, or component can also be present.

In the drawings, the thicknesses of layers and regions are exaggerated for clarity. For example, the thicknesses and sizes of elements in the drawings are arbitrarily shown for convenience of description, thus, the spirit and scope of the described technology are not necessarily defined by the drawings.

Also, it should also be noted that in some alternative implementations, the steps of all methods described herein can occur out of the order. For example, two steps illustrated in succession can in fact be executed substantially concurrently or the two steps can sometimes be executed in the reverse order.

Throughout the specification, it will be understood that when a layer, a film, a region, or an element is referred to as being "connected to" another layer, another film, another region, or another element, it can be directly connected to or it can be electrically connected to the other layer, the other film, the other region, or the other element by having an intervening layer, film, region, or element interposed therebetween.

As used herein, the term "and/or" includes any and all combinations of one or more of the associated listed items. Expressions such as "at least one of," when preceding a list of elements, modify the entire list of elements and do not modify the individual elements of the list. In this disclosure, the term "substantially" includes the meanings of completely, almost completely or to any significant degree under some applications and in accordance with those skilled in the art. The term "connected" can include an electrical connection.

Figure 2:
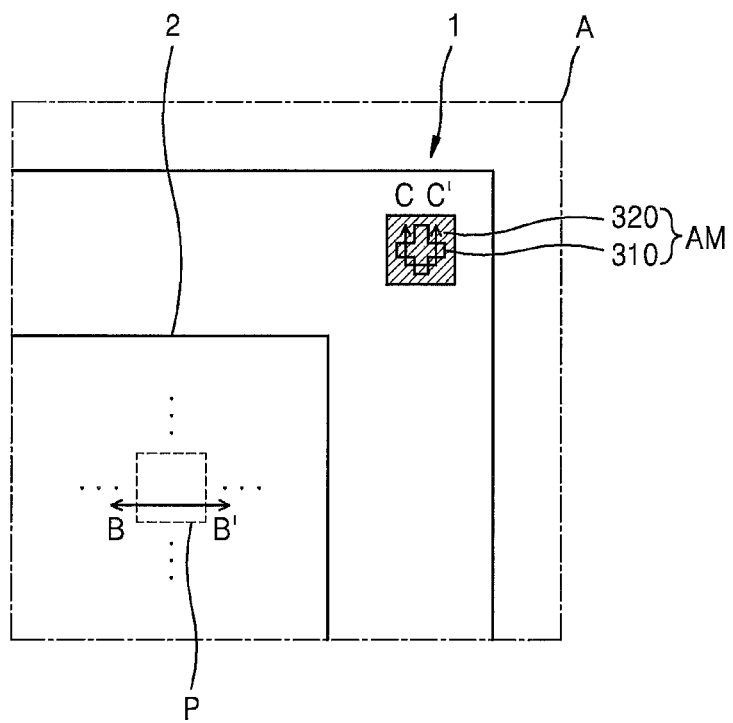
FIGS. 2 and 3 are plan views illustrating a portion A of FIG. 1, according to exemplary embodiments.
Figure 3:
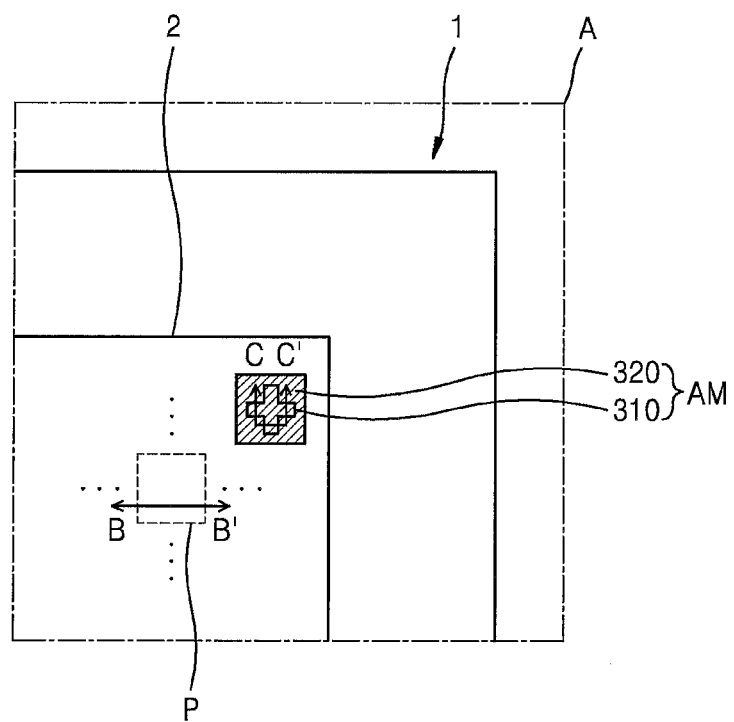

FIG. 1 is a plan view illustrating a mother substrate 1 for manufacture of a display device, according to an exemplary embodiment. FIGS. 2 and 3 are plan views illustrating a portion A of FIG. 1, according to exemplary embodiments.

Referring to FIGS. 1 through 3, a plurality of cell regions 2 and an alignment mark AM are positioned on the mother substrate 1. Each of the cell regions 2 can correspond to a display portion of a display device such as a liquid crystal display or an OLED display that includes a plurality of pixels P. A pixel circuit including at least one thin-film transistor (TFT) and a storage capacitor can be formed in each of the pixels P that are included in the display device.

The alignment mark AM can be positioned in an outer region that surrounds a pixel region in which the pixel P is formed. The alignment mark AM can be used a marker for alignment in a patterning process while the display device is manufactured. That is, in the patterning process of forming devices such as a thin-film transistor, electrodes, lines, or the like that configure the display device while the display device is manufactured, the alignment marks AM can be used to define positions of the devices and the lines. In some embodiments, the alignment marks AM are used not only to define the positions of the devices and the lines but can also be used in a process of cutting the mother substrate 1 that is performed after the patterning process.

In the present embodiment, as illustrated in FIG. 2, the alignment mark AM is positioned in an outer region of the cell region 2. The cell regions 2 can be cut and can be separated from the mother substrate 1 after a manufacturing procedure. In this case, the alignment mark AM does not remain in the cell region 2. In some embodiments, as illustrated in FIG. 3, the alignment mark AM is positioned in the cell region 2. In this case, even if the cell regions 2 are cut and are separated from the mother substrate 1 after the manufacturing procedure, the alignment mark AM can remain in the cell region 2.

The alignment mark AM can have a stack structure including a first layer 310 and a second layer 320.

The first layer 310 can have a cross-shape first pattern. In the present embodiment, the first pattern has a cross shape but one or more embodiments are not limited thereto. In some embodiments, the first pattern has one of various geometric patterns including a polygonal pattern, a circular pattern, an oval pattern, a star (*) pattern, a hash (#) pattern, or the like.

The second layer 320 can be formed on the first layer 310, and can have a size greater than a size of the first layer 310 and thus can completely cover the first layer 310. Since the first layer 310 has the first pattern, the second layer 320 formed on the first layer 310 can have a concave-convex shape along the first pattern of the first layer 310. For example, when the first layer 310 has the cross shape, the second layer 320 has a quadrangular shape so as to completely cover the first layer 310 as shown in FIGS. 2 and 3. But, in a thickness direction, the second layer 320 can have the concave-convex shape along the first pattern.

Figure 4:
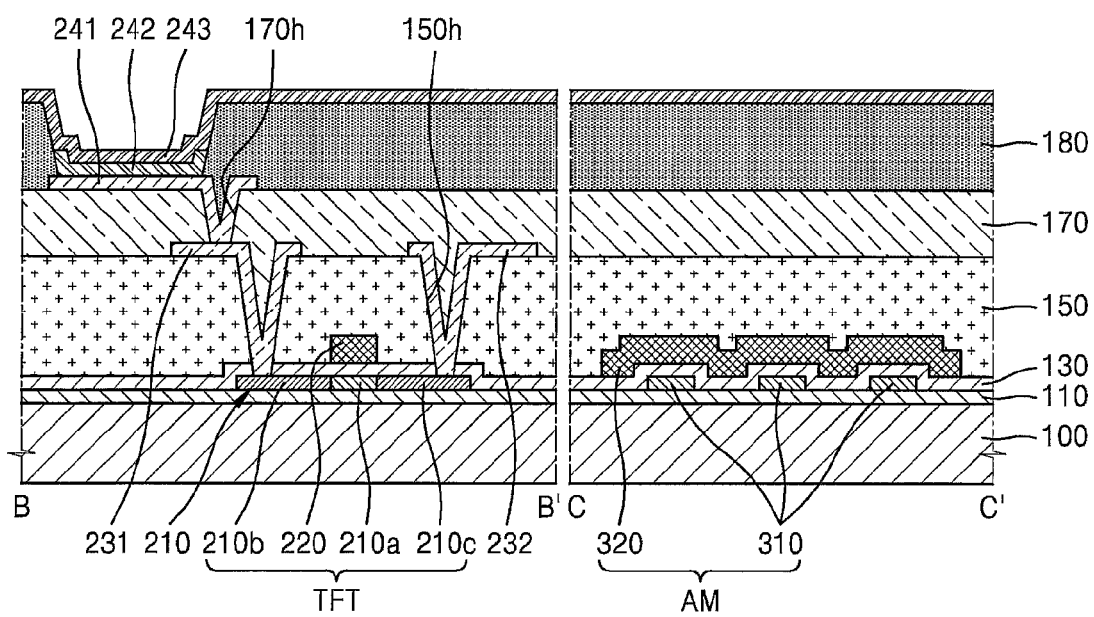
FIG. 4 illustrates cross-sectional views of the display device, according to an exemplary embodiment.

FIG. 4 illustrates cross-sectional views of the display device, taken along lines B-B' and C-C' of FIGS. 2 and 3, according to an exemplary embodiment.

Referring to FIG. 4, a buffer layer 110 is formed on a substrate 100, and a TFT and an alignment mark AM can be formed on the buffer layer 110. The substrate 100 can be formed of various materials including a glass material, a metal material, a plastic material such as polyethylen terephthalate (PET), polyethylen naphthalate (PEN), polyimide, or the like. In one or more embodiments, if the substrate 100 is formed of the plastic material or the metal material, flexibility of the substrate 100 can be improved in comparison to flexibility of the substrate 100 that is formed of the glass material. The buffer layer 110 can prevent penetration of foreign substances and can be formed of $SiO_2$ and/or SiNx, but one or more exemplary embodiments are not limited thereto.

The TFT includes an active layer 210, a gate electrode 220, a source electrode 210c, and a drain electrode 210b. The active layer 210 can include an oxide semiconductor. The oxide semiconductor can include at least one of indium (In), gallium (Ga), stannum (Sn), zirconium (Zr), vanadium (V), hafnium (Hf), cadmium (Cd), germanium (Ge), and zinc (Zn). For example, the oxide semiconductor can include indium gallium zinc oxide (IGZO) and/or indium tin zinc oxide (ITZO). In some embodiments, the oxide semiconductor is formed of at least one of $SnO_2$, $In_2O_3$, ZnO, CdO, $Cd_2SnO_4$, and $TiO_2$.

The active layer 210 can include a first portion that overlaps with the gate electrode 220, and second and third portions that are positioned at two sides of the first portion. The first portion can correspond to a channel region 210a, and the second and third portions that are doped with ion impurities can correspond to the drain electrode 210b and the source electrode 210c, respectively. In the embodiment of FIG. 4, the second portion corresponds to the drain electrode 210b, and the third portion corresponds to the source electrode 210c, but one or more exemplary embodiments are not limited thereto. According to a type of the TFT, positions of the drain electrode 210b and the source electrode 210c can be switched.

The gate electrode 220 is formed over the active layer 210 by having a first insulating layer 130 interposed therebetween, and here, the first insulating layer 130 is a gate insulating layer. The first insulating layer 130 can be an inorganic insulating layer including SiNx or SiOx but one or more exemplary embodiments are not limited thereto. The gate electrode 220 can be formed of at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

A second insulating layer 150 that is an interlayer insulating layer can be formed on the gate electrode 220. The second insulating layer 150 can be an inorganic insulating layer formed of SiNx or SiOx but one or more exemplary embodiments are not limited thereto. In some embodiments, the second insulating layer 150 is an organic insulating layer. The second insulating layer 150 can include contact holes 150h for exposing the source electrode 210c and the drain electrode 210b.

A data input electrode 232 and a data output electrode 231 can be positioned on the second insulating layer 150, and can be respectively connected to the source electrode 210c and the drain electrode 210b. The data input electrode 232 can be connected to the source electrode 210c of the TFT via the contact hole 150h of the second insulating layer 150, and the data output electrode 231 can be connected to the drain electrode 210b of the TFT via the contact hole 150h of the second insulating layer 150 that is different from the contact hole 150h for the data input electrode 232. The data input electrode 232 and the data output electrode 231 can be formed of metal such as Au, Ag, Cu, Ni, Pt, Pd, Al, and Mo, or a metal alloy such as Al:Nd alloy or Mo:W alloy, but one or more exemplary embodiments are not limited thereto.

A third insulating layer 170 that is a planarization layer can be positioned on the data input electrode 232 and the data output electrode 231. The third insulating layer 170 can have a via hole 170h for exposing the data output electrode 231. The data output electrode 231 can be electrically connected to a pixel electrode 241 via the via hole 170h of the third insulating layer 170.

The pixel electrode 241 can be formed on the third insulating layer 170 and can be a transparent (or translucent) electrode or a reflective electrode. When the pixel electrode 241 is a transparent (or translucent) electrode, the pixel electrode 241 can be formed of at least one of indium tin oxide (ITO), indium zinc oxide (IZO), zinc oxide (ZnO), indium oxide ($In_2O_3$), indium gallium oxide (IGO), and aluminum zinc oxide (AZO). If the pixel electrode 241 is a reflective electrode, the pixel electrode 241 can include a reflective layer that is formed of Ag, Mg, Al, Pt, Pd, Au, Ni, Nd, Ir, Cr, or a compound thereof.

A pixel-defining layer 180 can be formed on the pixel electrode 241. The pixel-defining layer 180 can have an opening for exposing a top surface of the pixel electrode 241, and an intermediate layer 242 can be formed in the opening.

The intermediate layer 242 can include an emission layer. The emission layer can be formed of a low molecular weight material or a high molecular weight material that can emit red light, green light, or blue light. In addition to the emission layer, the intermediate layer 242 can further include at least one selected from a hole injection layer (HIL), a hole transport layer (HTL), an electron transport layer (ETL), and an electron injection layer (EIL).

An opposite electrode 243 can be a reflective electrode or a transparent (or translucent) electrode. When the opposite electrode 243 is a transparent (or translucent) electrode, the opposite electrode 243 can have a structure in which a layer including Li, Ca, LiF/Ca, LiF/Al, Al, Mg or a compound thereof is formed, and another layer including a transparent (or translucent) material such as ITO, IZO, ZnO or $In_2O_3$ is formed on the layer. When the opposite electrode 243 is a reflective electrode, the opposite electrode 243 can be formed of at least one of Li, Ca, LiF/Ca, LiF/Al, Al, Ag, and Mg.

The alignment mark AM can have the first layer 310 and the second layer 320. The first layer 310 can be formed of the same material as the active layer 210, and the first layer 310 can have the first pattern such as the cross-shape pattern as described above with reference to FIGS. 2 and 3.

The second layer 320 can be formed of the same material as the gate electrode 220. The size of the second layer 320 can be greater than the size of the first layer 310 and thus can completely cover the first layer 310. Since the first layer 310 has the first pattern, the second layer 320 formed on the first layer 310 can have a concave-convex shape along the first pattern of the first layer 310. For example, when the first layer 310 has the cross shape, the second layer 320 completely covers the first layer 310 and has, in a thickness direction, convex portions having a cross shape formed along the first pattern, and concave portions around the convex portions.

As described above with reference to FIG. 4, the pixel-defining layer 180, the intermediate layer 242, and the opposite electrode 243 are sequentially formed on the pixel electrode 241, thereby forming an OLED display. Each of elements of the OLED display, e.g., electrodes and lines, is patterned with respect to the alignment mark AM.

FIGS. 5A through 5F are cross-sectional views illustrating processes of a method of manufacturing the display device, according to an exemplary embodiment.

Figure 5A:
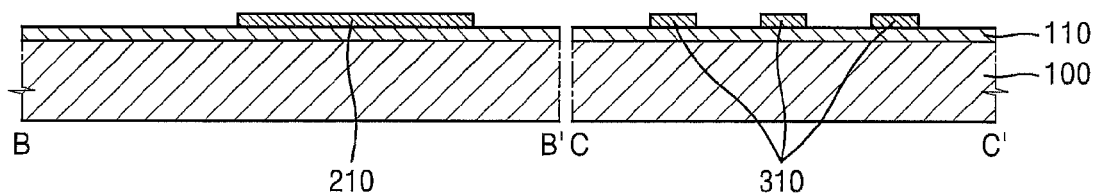
FIGS. 5A through 5F are cross-sectional views illustrating processes of a method of manufacturing the display device, according to an exemplary embodiment.

Referring to FIG. 5A, the buffer layer 110 is formed on the substrate 100, and an oxide semiconductor (not shown) is formed and is patterned, so that the active layer 210, and the first layer 310 of the alignment mark AM are formed.

The oxide semiconductor can be formed of at least one of In, Ga, Sn, Zr, V, Hf, Cd, Ge, and Zn. For example, the oxide semiconductor is formed of IGZO, ITZO, ZnO, CdO, $Cd_2SnO_4$, or $TiO_2$.

The first layer 310 can be formed of the same material as the active layer 210, and can have a cross-shape first pattern. In the present embodiment, the first patter has the cross shape but one or more exemplary embodiments are not limited thereto. For example, the first pattern has one of various geometric patterns including a polygonal pattern, a circular pattern, an oval pattern, a star (*) pattern, a hash (#) pattern, or the like.

Figure 5B:
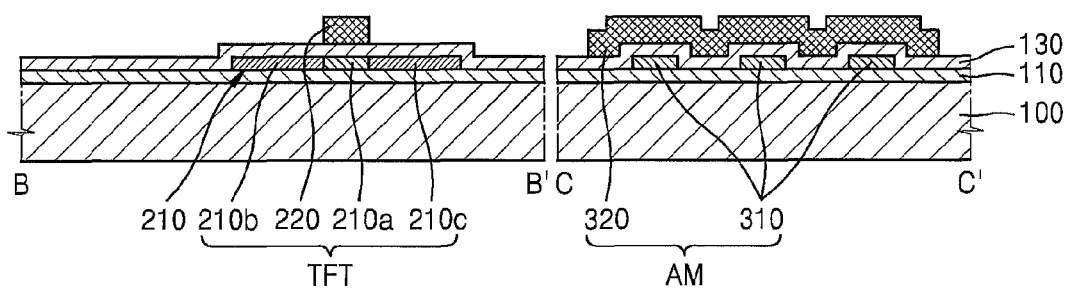

Referring to FIG. 5B, the first insulating layer 130 that is a gate insulating layer is formed on the substrate 100, and a metal layer (not shown) is formed and is patterned, so that the gate electrode 220 and the second layer 320 of the alignment mark AM are formed.

The metal layer can be formed of at least one of Al, Pt, Pd, Ag, Mg, Au, Ni, Nd, Ir, Cr, Li, Ca, Mo, Ti, W, and Cu.

The second layer 320 can be formed of the same material as the gate electrode 220. The second layer 320 can be formed on the first layer 310 while the second layer 320 completely covers the first layer 310, and the first pattern of the first layer 310 can be applied to the second layer 320. For example, portions of the second layer 320 that correspond to the first pattern of the first layer 310 extends in a thickness direction of the second layer 320, and other portions of the second layer 320 are relatively recessed, so that the second layer 320 can have the concave and convex portions formed along the first pattern of the first layer 310.

Afterward, ion impurities can be doped in the active layer 210 by using the gate electrode 220 is used as a self-alignment mask, so that second and third portions of the active layer 210 that correspond to the source electrode 210c and the drain electrode 210b can be formed. Since a portion of the active layer 210, i.e., a first portion of the active layer 210 is covered by the gate electrode 220, the first portion corresponds to an undoped channel region. Since the second layer 320 completely covers the first layer 310, when the ion impurities are doped, the first layer 310 is not doped.

Figure 5C:
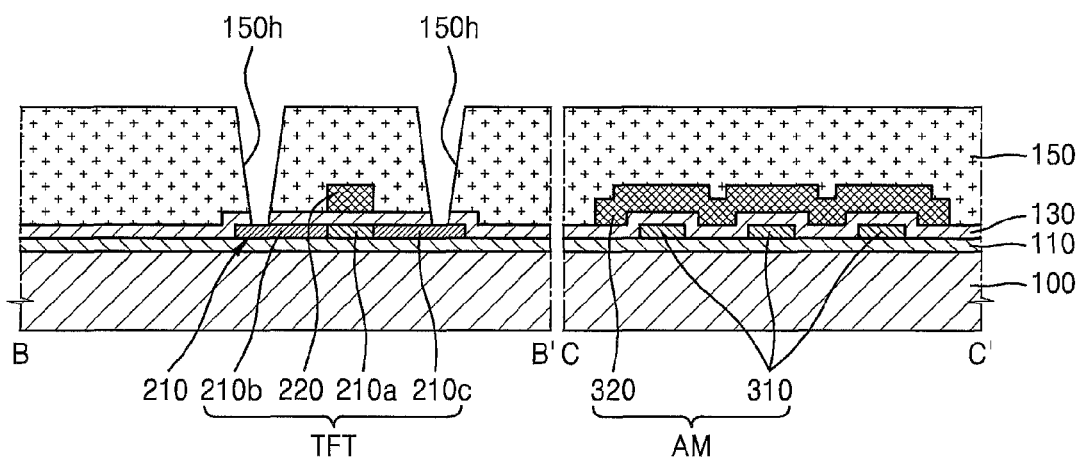

Referring to FIG. 5C, the second insulating layer 150 that is an interlayer insulating layer is formed on the substrate 100, and the contact holes 150h are formed in the second insulating layer 150. Positions of the contact holes 150h can be defined by recognizing the concave and convex portions of the alignment mark AM, i.e., the first pattern that is applied to the second layer 320. The second insulating layer 150 can be formed of an inorganic insulating layer or an organic insulating layer, and the source electrode 210c and the drain electrode 210b of the active layer 210 can be exposed via the contact holes 150h.

Figure 5D:
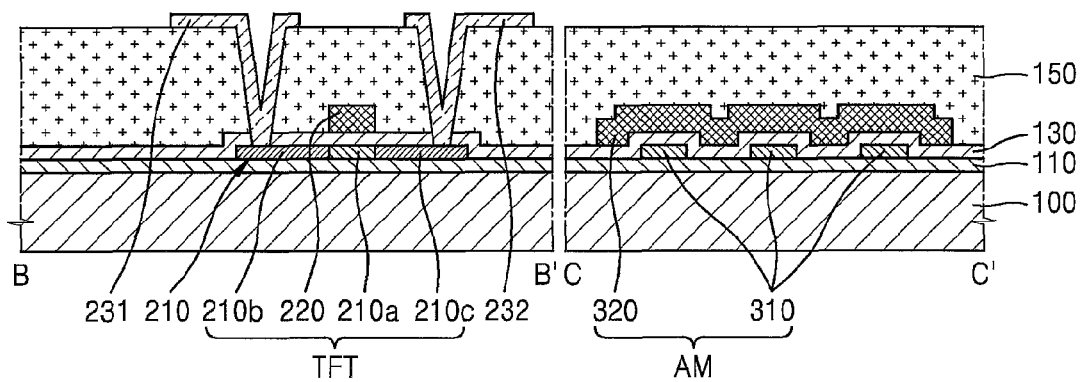

Referring to FIG. 5D, the data input electrode 232 and the data output electrode 231 are formed by using the alignment mark AM. A metal layer (not shown) can be formed and can be patterned so as to form the data input electrode 232 and the data output electrode 231 by using the alignment mark AM. For example, the metal layer is patterned so as to form the data input electrode 232 and the data output electrode 231 by recognizing the concave and convex portions of the alignment mark AM, i.e., the first pattern that is applied to the second layer 320. The metal layer can be formed of Au, Ag, Cu, Ni, Pt, Pd, Al, Mo, or a metal alloy such as Al:Nd alloy or Mo:W alloy, but one or more exemplary embodiments are not limited thereto.

Figure 5E:
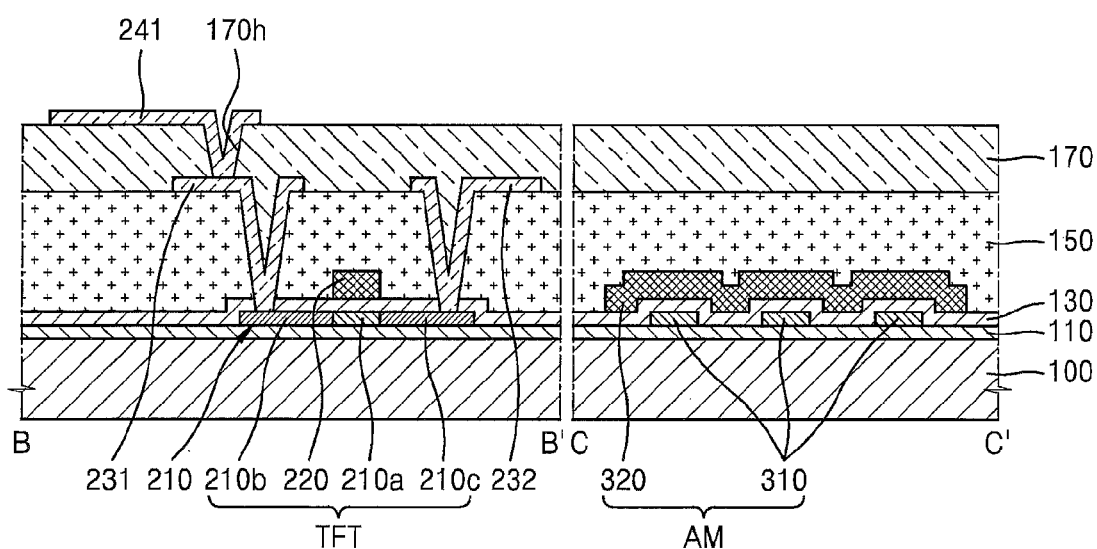

Referring to FIG. 5E, the third insulating layer 170 that is a planarization layer is formed on the substrate 100, and the via hole 170h is formed in the third insulating layer 170 by using the alignment mark AM. A position of the via hole 170h can be defined by recognizing the concave and convex portions of the alignment mark AM, i.e., the first pattern that is applied to the second layer 320. The third insulating layer 170 can be formed of an inorganic insulating layer or an organic insulating layer, and the data output electrode 231 can be exposed via the via hole 170h.

Afterward, the pixel electrode 241 can be formed by using the alignment mark AM. The pixel electrode 241 can be a transparent (or translucent) electrode or a reflective electrode, and a material therefor is described above with reference to FIG. 4.

Figure 5F:
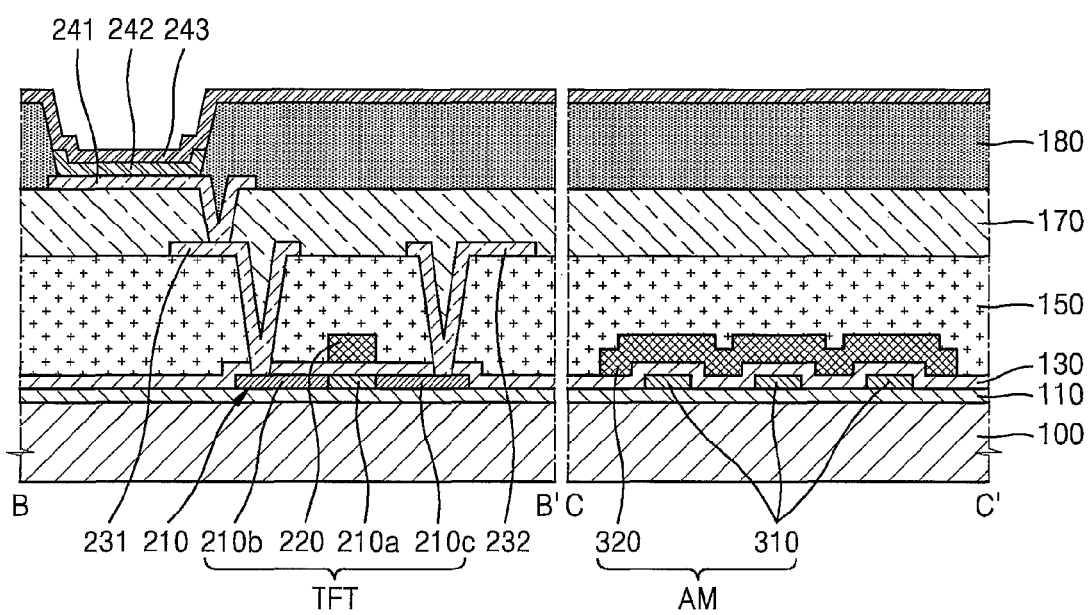

Referring to FIG. 5F, the pixel-defining layer 180 having an opening for exposing a portion of the pixel electrode 241 is formed on the pixel electrode 241, and the intermediate layer 242 is formed in the opening of the pixel-defining layer 180. Afterward, the opposite electrode 243 is formed, so that the organic light-emitting display device can be manufactured.

In the one or more exemplary embodiments, the alignment mark AM includes the first layer 310 and the second layer 320, and the second layer 320 has the concave and convex portions along the first pattern of the first layer 310, so that a margin due to misalignment in a next patterning process using the alignment mark AM can be significantly decreased.

In a comparative example, if an alignment mark AM is formed of only an oxide semiconductor, it is difficult to recognize the alignment mark AM since the oxide semiconductor has a transparent characteristic. Thus, the alignment mark AM that is formed of only the oxide semiconductor cannot be used.

In another comparative example, if a display device is manufactured by using an alignment mark AM formed on the same layer as the gate electrode 220, the alignment mark AM can be recognized as a marker but a margin due to misalignment is increased, such that it is difficult to form devices and lines for a high-definition display device. For example, while a display device including a top-gate type TFT is manufactured, the alignment mark AM according to the other comparative example can be formed from a same layer as the gate electrode 220. In a manufacture procedure according to the other comparative example, it is assumed that a margin due to misalignment between the active layer 210 and the gate electrode 220 is Δa.

A process of forming the contact hole 150h in a second insulating layer, and a process of forming the data input electrode 232 and the data output electrode 231 can be performed, by using the alignment mark AM according to the other comparative example. Here, it is assumed that a margin due to misalignment of the contact hole 150h is Δb, and a margin due to misalignment between the data input electrode 232 and the data output electrode 231 is Δc.

Since the display device according to the another comparative example is manufactured by using the alignment mark AM formed from the same layer as the gate electrode 220, the margin Δa due to the misalignment keeps affecting following processes. For example, a margin due to misalignment between the active layer 210 and the contact hole 150h is Δa+Δb, and a margin due to misalignment between the active layer 210 and the data input electrode 232 and the data output electrode 231 is Δa+Δc. Similarly, the margin Δa due to the misalignment can affect a next process of forming the pixel electrode 241.

In the display device according to the another comparative example, when the gate electrode 220 is misaligned by Δa with respect to the active layer 210, the misaligned margin Δa is applied to the alignment mark AM, such that the misaligned margin Δa keeps affecting following processes.

However, according to at least one of the disclosed embodiments, the alignment mark AM has the first layer 310 and the second layer 320, and the first pattern of the first layer 310 is changelessly applied to the second layer 320. Therefore, the misaligned margin Δa is not applied to the alignment mark AM. That is, even if the gate electrode 220 is misaligned by Δa with respect to the active layer 210, the first pattern of the first layer 310 is changelessly applied to the second layer 320, and alignment in a patterning process is performed by using the first pattern (i.e., the concave and convex portions) that is applied to the second layer 320, so that the misaligned margin Δa does not affect following processes.

Figure 6:
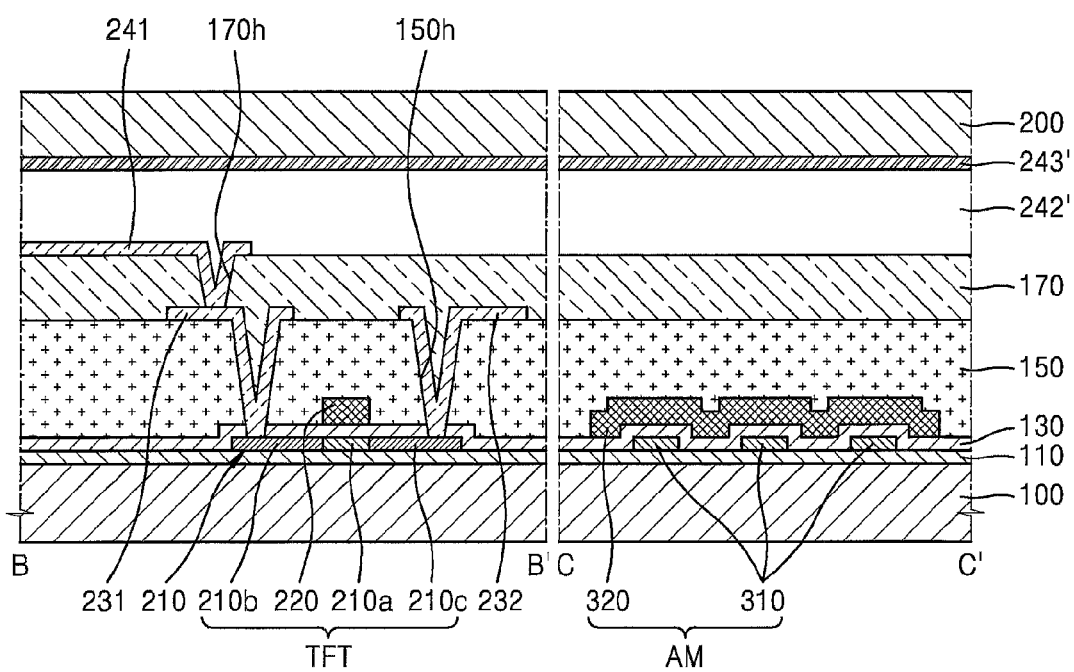
FIG. 6 is a cross-sectional view of a display device, according to another exemplary embodiment.

FIG. 6 is a cross-sectional view of a display device, according to another exemplary embodiment.

While the method of manufacturing the OLED display is described above with reference to FIGS. 5A through 5F, one or more exemplary embodiments are not limited thereto. After a manufacturing procedure with reference to FIGS. 5A through 5E is performed, as illustrated in FIG. 6, an opposite substrate 200 whereon an opposite electrode 243' is formed is formed, and a liquid crystal layer 242' is formed between the pixel electrode 241 and the opposite electrode 243', so that a liquid crystal display can be manufactured.

Figure 7:
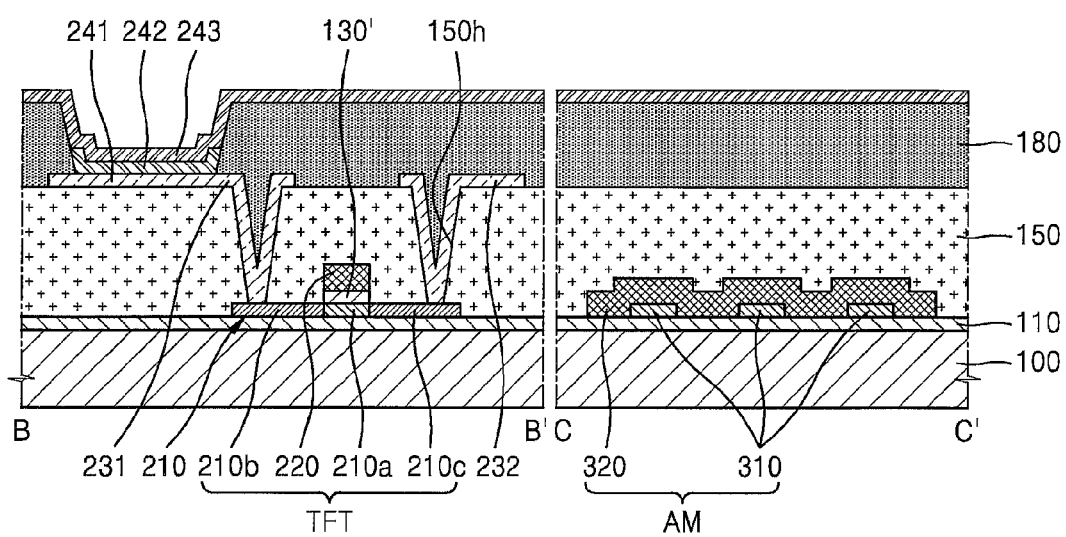
FIG. 7 is a cross-sectional view of a display device, according to another exemplary embodiment.

FIG. 7 is a cross-sectional view of a display device, according to another exemplary embodiment.

Referring to FIG. 7, the buffer layer 110 is formed on the substrate 100, and the TFT and an alignment mark AM are formed on the buffer layer 110. The substrate 100 can be formed of various materials including a glass material, a metal material, a plastic material, or the like. The buffer layer 110 can be formed of $SiO_2$ and/or $SiN_x$, but one or more exemplary embodiments are not limited thereto.

The active layer 210 of the TFT can include an oxide semiconductor. The oxide semiconductor can be formed of at least one of In, Ga, Sn, Zr, V, Hf, Cd, Ge, and Zn. For example, the oxide semiconductor is formed of IGZO and/or ITZO. In some embodiments, the oxide semiconductor is formed of at least one of $SnO_2$, $In_2O_3$, ZnO, CdO, $Cd_2SnO_4$, and $TiO_2$.

The gate electrode 220 can be formed over the active layer 210 and can partially overlap a portion of the active layer 210. A first insulating layer 130' that is a gate insulating layer can be patterned to be positioned only between the active layer 210 and the gate electrode 220. For example, the second insulating layer 150 is formed to have substantially the same pattern as the gate electrode 220. The first insulating layer 130' can be an inorganic insulating layer formed of $SiN_x$ or $SiO_x$ but one or more exemplary embodiments are not limited thereto.

The active layer 210 can include a first portion that overlaps with the gate electrode 220, and second and third portions that are positioned at two sides of the first portion. The first portion can correspond to a channel region 210a, and the second and third portions can become conductive via a deoxidation process using plasma or the like and can respectively correspond to the drain electrode 210b and the source electrode 210c.

The second insulating layer 150 that is an interlayer insulating layer can be formed on the gate electrode 220, and can include the contact holes 150h for exposing the source electrode 210c and the drain electrode 210b.

The data input electrode 232 and the data output electrode 231 can be positioned on the second insulating layer 150, and can be respectively connected to the source electrode 210c and the drain electrode 210b. The data input electrode 232 can be connected to the source electrode 210c of the TFT via the contact hole 150h of the second insulating layer 150, and the data output electrode 231 can be electrically connected to the drain electrode 210b of the TFT via the contact hole 150h of the second insulating layer 150 that is different from the contact hole 150h for the data input electrode 232.

The data output electrode 231 can be electrically connected to the pixel electrode 241. In the display device described with reference to FIG. 4, the data output electrode 231 is electrically connected to the pixel electrode 241 via the via hole 170h of the third insulating layer 170, but, as illustrated in the present embodiment of FIG. 7, a portion of the data output electrode 231 can be directly connected to the pixel electrode 241, e.g., the portion of the data output electrode 231 can be formed on the same layer as the pixel electrode 241, so that the data output electrode 231 can be electrically connected to the pixel electrode 241. The pixel electrode 241 and the data output electrode 231 can be formed of the same metal, and the pixel electrode 241 can be a reflective electrode. For example, the data input electrode 232, the data output electrode 231, and the pixel electrode 241 are formed of Ag, Mg, Al, Pt, Pd, Au, Ni, Nd, Ir, Cr, Al, Mo, or a compound thereof, but one or more exemplary embodiments are not limited thereto.

The pixel-defining layer 180 can have an opening for exposing a top surface of the pixel electrode 241, the intermediate layer 242 can be formed in the opening, and the opposite electrode 243 can be formed on the intermediate layer 242.

The intermediate layer 242 can include an emission layer. In addition to the emission layer, the intermediate layer 242 can further include at least one of a HIL, a HTL, an ETL, and/or an EIL.

The opposite electrode 243 can be a transparent (or translucent) electrode having a structure in which a layer formed of Li, Ca, LiF/Ca, LiF/Al, Al, Mg or a compound thereof is formed, and another layer formed of a transparent (or translucent) material such as ITO, IZO, ZnO or $In_2O_3$ is formed on the layer.

The alignment mark AM can have the first layer 310 and the second layer 320. The first layer 310 can be formed of the same material as the active layer 210, and as described above with reference to FIGS. 2 and 3, the first layer 310 can have the cross-shape first pattern.

The second layer 320 can be formed on the first layer 310 and can directly contact the first layer 310. The second layer 320 can be formed of the same material as the gate electrode 220. A size of the second layer 320 can be greater than a size of the first layer 310 and thus can completely cover the first layer 310. Since the first layer 310 has the first pattern, the second layer 320 formed over the first layer 310 can have a concave-convex shape along the first pattern of the first layer 310. For example, the second layer 320 completely covers the first layer 310 while the second layer 320 in a thickness direction has convex and concave portions formed along the first pattern.

As described above with reference to FIG. 7, the pixel-defining layer 180, the intermediate layer 242, and the opposite electrode 243 are sequentially formed on the pixel electrode 241, thereby forming an OLED display. Electrodes and lines included in the OLED display are patterned with respect to the alignment mark AM.

FIGS. 8A through 8E are cross-sectional views illustrating processes of a method of manufacturing the display device, according to another exemplary embodiment.

Figure 8A:
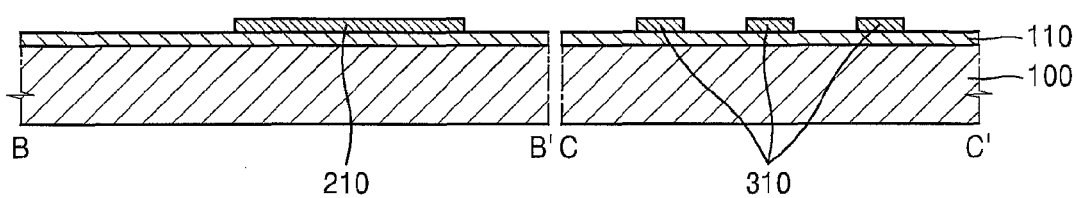
FIGS. 8A through 8E are cross-sectional views illustrating processes of a method of manufacturing the display device, according to another exemplary embodiment.

Referring to FIG. 8A, the buffer layer 110 is formed on the substrate 100, and an oxide semiconductor (not shown) is formed and is patterned, so that the active layer 210, and the first layer 310 of the alignment mark AM are formed.

The oxide semiconductor can be formed of at least one of In, Ga, Sn, Zr, V, Hf, Cd, Ge, and Zn. For example, the oxide semiconductor is formed of IGZO, ITZO, ZnO, CdO, $Cd_2SnO_4$, or $TiO_2$.

The first layer 310 can be formed of the same material as the active layer 210, and can have a cross-shape first pattern. In the present embodiment, the first patter has the cross shape but one or more exemplary embodiments are not limited thereto. For example, the first pattern has one of various geometric patterns including a polygonal pattern, a circular pattern, an oval pattern, a star (*) pattern, a hash (#) pattern, or the like.

Figure 8B:
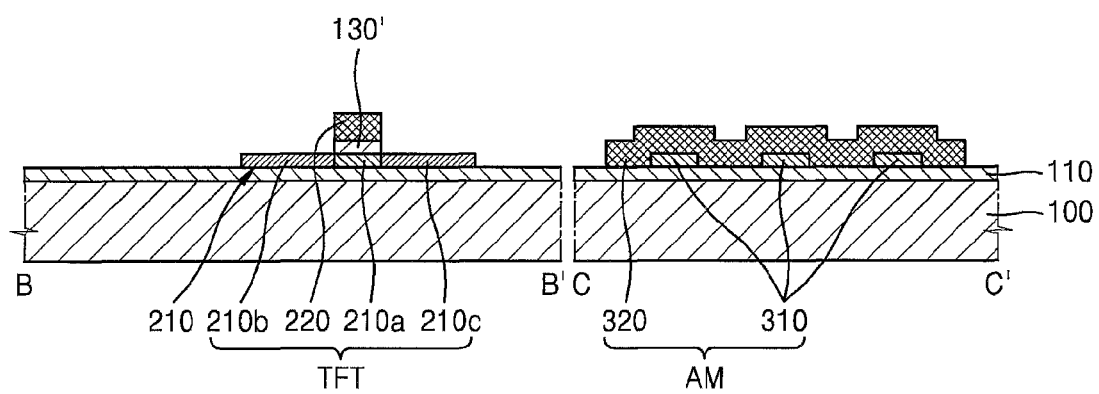

Referring to FIG. 8B, the first insulating layer 130 that is a gate insulating layer is formed on the substrate 100, and a metal layer (not shown) is formed and is patterned, so that the gate electrode 220, and the second layer 320 of the alignment mark AM are formed.

The metal layer can be formed of Al, Pt, Pd, Ag, Mg, Au, Ni, Nd, Ir, Cr, Li, Ca, Mo, Ti, W, and Cu.

While the gate electrode 220 is patterned, the first insulating layer 130' can be patterned to be interposed only between the active layer 210 and the gate electrode 220.

The second layer 320 can be formed of the same material as the gate electrode 220. The second layer 320 can be formed over the first layer 310 so as to completely cover the first layer 310, and since the first insulating layer 130' is patterned, the second layer 320 can directly contact the first layer 310.

The first pattern can be changelessly applied to the second layer 320 formed over the first layer 310. For example, portions of the second layer 320 that correspond to the first pattern of the first layer 310 extend in a thickness direction of the second layer 320, and other portions of the second layer 320 are relatively recessed, so that the second layer 320 has the concave and convex portions formed along the first pattern of the first layer 310.

Afterward, a deoxidation process using plasma or the like is performed by using the gate electrode 220 as a self-alignment mask, so that the second and third portions that are positioned at two sides of the first portion that corresponds to the channel region 210a can become conductive via the deoxidation process. The second and third portions can correspond to the source electrode 210c and the drain electrode 210b, respectively.

Figure 8C:
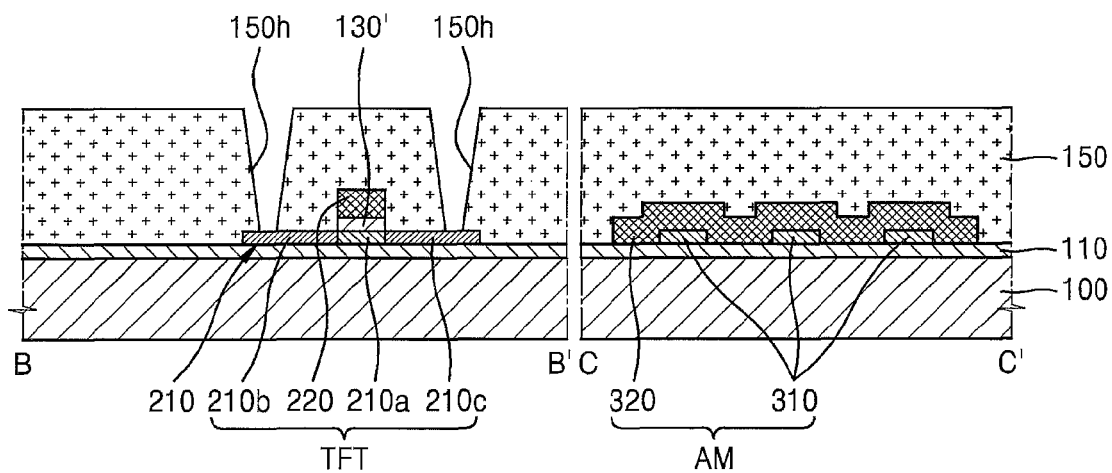

Referring to FIG. 8C, the second insulating layer 150 that is an interlayer insulating layer is formed on the substrate 100, and the contact holes 150h are formed in the second insulating layer 150 by using the alignment mark AM. Positions of the contact holes 150h can be defined by recognizing the concave and convex portions of the alignment mark AM, i.e., the first pattern that is applied to the second layer 320.

The second insulating layer 150 can be formed of an inorganic insulating layer or an organic insulating layer, and the source electrode 210c and the drain electrode 210b of the active layer 210 can be exposed via the contact holes 150h.

Figure 8D:
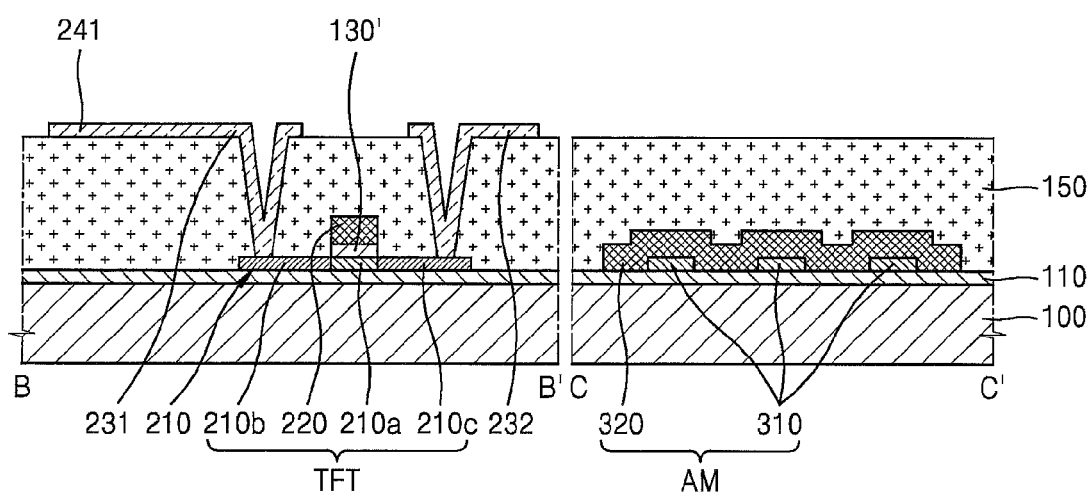

Referring to FIG. 8D, the data input electrode 232, the data output electrode 231, and the pixel electrode 241 are formed by using the alignment mark AM. A metal layer (not shown) can be formed and can be patterned so as to form the data input electrode 232, the data output electrode 231, and the pixel electrode 241 by using the alignment mark AM. The metal layer can be formed of Ag, Mg, Al, Pt, Pd, Au, Ni, Nd, Ir, Cr, Al, Mo, or a compound thereof but one or more exemplary embodiments are not limited thereto.

The concave and convex portions of the alignment mark AM, e.g., the first pattern that is applied to the second layer 320 can be recognized, so that the data input electrode 232 and the data output electrode 231 can be patterned. The pixel electrode 241 and the data output electrode 231 can be integrally formed on the same layer, and thus, the pixel electrode 241 can be electrically connected to the data output electrode 231.

Figure 8E:
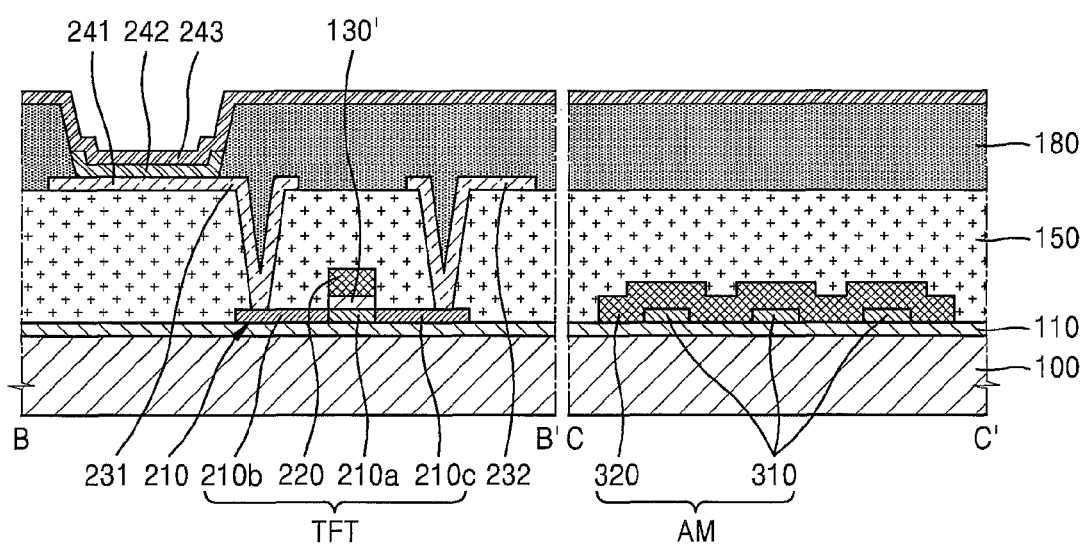

Referring to FIG. 8E, the pixel-defining layer 180 having an opening for exposing a portion of the pixel electrode 241 is formed on the pixel electrode 241, and the intermediate layer 242 is formed in the opening of the pixel-defining layer 180. Afterward, the opposite electrode 243 is formed, so that an OLED display can be formed. The intermediate layer 242 and the opposite electrode 243 are described above with reference to FIG. 7.

In the one or more exemplary embodiments, the alignment mark AM includes the first layer 310 and the second layer 320, and the second layer 320 has the concave and convex portions along the first pattern of the first layer 310, so that a margin due to misalignment in a next patterning process using the alignment mark AM can be significantly decreased.

In a comparative example, if a display device is manufactured by using an alignment mark AM formed on the same layer as the gate electrode 220, when the gate electrode 220 is misaligned by Δa with respect to the active layer 210, the misaligned margin Δa is applied to the alignment mark AM, such that the misaligned margin Δa keeps affecting following processes.

However, according to at least one of the disclosed embodiments, the first pattern of the first layer 310 is changelessly applied to the second layer 320 of the alignment mark AM, and in a patterning process, alignment, i.e., patterning is performed by using the first pattern (i.e., the concave and convex portions) that is applied to the second layer 320. Therefore, even if the gate electrode 220 is misaligned by Δa with respect to the active layer 210, the misaligned margin Δa does not affect following processes.

Figure 9:
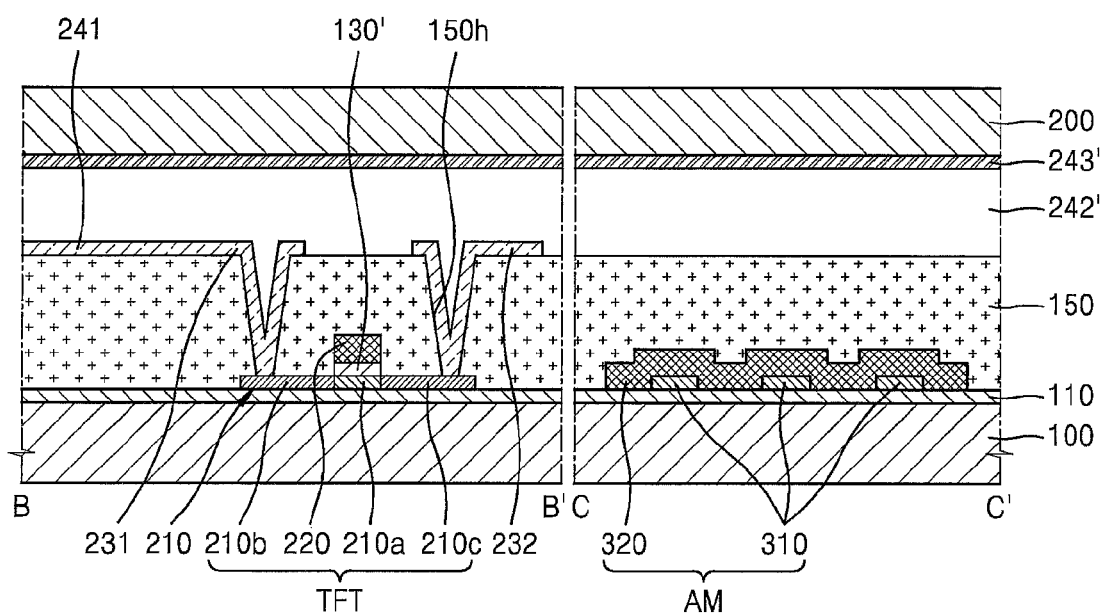
FIG. 9 is a cross-sectional view of a display device, according to another exemplary embodiment.

FIG. 9 is a cross-sectional view of a display device, according to another exemplary embodiment.

While the method of manufacturing the OLED display is described above with reference to FIGS. 8A through 8E, one or more exemplary embodiments are not limited thereto.

After a manufacturing procedure with reference to FIGS. 8A through 8E is performed, as illustrated in FIG. 9, an opposite substrate 200 whereon an opposite electrode 243' is formed is formed, and a liquid crystal layer 242' is formed between the pixel electrode 241 and the opposite electrode 243', so that a liquid crystal display can be manufactured.

As described above, the manufacturing method according to the one or more of the above exemplary embodiments can significantly decrease a margin due to misalignment of elements such as electrodes, lines, etc., that configure the display device.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details can be made therein without departing from the spirit and scope as defined by the following claims.

What is claimed is:

1. A method of manufacturing a display device, the method comprising:
    forming an active layer over a substrate;
    forming a first insulating layer over the active layer;
    forming a gate electrode over the active layer; and
    forming an alignment mark over the substrate,
    wherein the forming of the alignment mark comprises:
        forming a first layer including a first pattern; and
        forming a second layer over the first layer and including concave and convex portions formed along the first pattern.

2. The method of claim 1, wherein the first layer is light transmissive.

3. The method of claim 1, wherein the active layer is formed of an oxide semiconductor.

4. The method of claim 1, wherein the first layer is formed on the same layer as the active layer.

5. The method of claim 1, wherein the second layer is formed of the same material as the gate electrode.

6. The method of claim 1, wherein the second layer completely covers the first layer.

7. The method of claim 6, wherein the convex portions of the second layer are formed along the first pattern of the first layer, and wherein the concave portions of the second layer are recessed with respect to the convex portions.

8. The method of claim 1, further comprising forming source and drain electrodes at two sides of a first portion of the active layer, wherein the first portion overlaps the gate electrode.

9. The method of claim 8, wherein the first layer is formed of the same material as the first portion.

10. The method of claim 8, further comprising forming, via the alignment mark, a data input electrode, connected to one of the source and drain electrodes, and a data output electrode, connected to the other one of the source and drain electrodes.

11. The method of claim 10, wherein the data output electrode is electrically connected to a pixel electrode.

12. The method of claim 10, further comprising:
    forming a second insulating layer between the data input and output electrodes and the gate electrode; and
    forming, via the alignment mark, a plurality of contact holes penetrating the second insulating layer.

13. The method of claim 1, wherein the substrate comprises a pixel region and a peripheral region surrounding the pixel region, wherein the active layer and the gate electrode are formed in the pixel region, and wherein the alignment mark is formed in the peripheral region.

14. A method of manufacturing a display device, the method comprising:
    concurrently forming an active pattern and a first layer of an alignment mark over a substrate; and
    concurrently forming a gate electrode and a second layer of the alignment mark over the substrate,
    wherein the first layer includes a first pattern, and wherein the second layer is formed over the first layer and includes concave and convex portions formed along the first pattern.

15. The method of claim 14, wherein the second layer completely covers the first layer.

16. The method of claim 15, wherein the convex portions of the second layer are formed along the first pattern of the first layer, and wherein the concave portions of the second layer are recessed with respect to the convex portions.

17. The method of claim 14, further comprising forming a first insulating layer between forming the first and second layers.

18. The method of claim 14, wherein at least one groove is formed in a top portion of the second layer.

* * * * *